United States Patent [19]

Jagannathan et al.

[11] Patent Number: 6,136,498
[45] Date of Patent: Oct. 24, 2000

[54] POLYMER-BOUND SENSITIZER

[75] Inventors: Premlatha Jagannathan, Patterson; Leo L. Linehan, Walden; Wayne M. Moreau, Wappinger Falls; Randolph J. Smith, Newburgh, all of N.Y.

[73] Assignee: International Business Machines Corporation, Armonk, N.Y.

[21] Appl. No.: 08/672,804

[22] Filed: Jun. 28, 1996

[51] Int. Cl.$^7$ ..................................................... G03F 7/004
[52] U.S. Cl. ....................... 430/270.1; 430/905; 430/910; 430/915; 430/922; 430/926; 430/927
[58] Field of Search ................................ 430/270.1, 915, 430/926, 927, 922, 905, 910

[56] References Cited

U.S. PATENT DOCUMENTS

| | | | |
|---|---|---|---|
| 4,188,223 | 2/1980 | Woodbrey et al. | 430/270.1 |
| 4,234,674 | 11/1980 | Woodbrey et al. | 430/253 |
| 4,371,605 | 2/1983 | Renner | 430/280.1 |
| 4,550,069 | 10/1985 | Pampalone | 430/165 |
| 4,937,292 | 6/1990 | Slemon | 204/157.67 |
| 5,059,512 | 10/1991 | Babich et al. | 430/280.1 |
| 5,066,561 | 11/1991 | Pampalone | 430/169 |
| 5,141,840 | 8/1992 | Mizutani et al. | 403/270.1 |
| 5,266,444 | 11/1993 | Carpenter et al. | 430/280.1 |
| 5,296,332 | 3/1994 | Sachdev et al. | 430/270.1 |
| 5,322,765 | 6/1994 | Clecak et al. | 430/326 |
| 5,356,752 | 10/1994 | Cabrera et al. | 430/270.1 |
| 5,376,503 | 12/1994 | Audett et al. | 430/270.1 |
| 5,607,824 | 3/1997 | Fahey et al. | 430/510 |
| 5,629,135 | 5/1997 | Kobayashi et al. | 430/270.1 |
| 5,654,376 | 8/1997 | Knors et al. | 430/270.1 |
| 5,677,112 | 10/1997 | Urano et al. | 430/270.1 |

*Primary Examiner*—John S. Chu
*Attorney, Agent, or Firm*—Schmeiser, Olsen & Watts; Lawrence D. Cutter

[57] ABSTRACT

A photoresist composition for use in lithographic processes in the fabrication of semiconductor devices such as integrated circuit structures is disclosed. The photoresist composition includes a monomeric sensitizer bounding to a base-soluble long chain polymer.

4 Claims, No Drawings

POLYMER-BOUND SENSITIZER

TECHNICAL FIELD

This invention relates generally to a photoresist composition for use in the manufacture of semiconductor integrated circuits, and more specifically to a photoresist composition suitable for use as: (i) a sensitizer for lithographic processes, including exposure to such energy sources as ultraviolet light, X-rays, ion beams and electron beams; ii) a soluble dye for deep ultraviolet positive or negative photoresists; and (iii) a polymer backbone in a terpolymer acid labile photoresist formulation.

BACKGROUND OF THE INVENTION

Lithographic processes are used in the manufacture of semiconductor devices, such as integrated circuit chips. The processes typically involve the steps of depositing a layer of a photoresist material, e.g., one which will react when exposed to light, onto a device substrate, such as a circuit chip wafer, by means such as spin-apply; baking the device, typically at a temperature of approximately 110° Celsius (C), although high bakes can occur at temperatures above 140° C., to set the photoresist layer,; selectively exposing portions of the photoresist layer to light, e.g. ultraviolet (UV) light, or other ionizing radiation, e.q. X-rays and ion or electron beams; and developing the photoresist layer by washing with a basic developer solution, e.g. tetramethylammonium hydroxide (TMAH), thereby removing the non-irradiated (as in a negative photoresist) or the irradiated (as in a positive photoresist) portions of the photoresist layer. This process, along with typical photoresist materials are described in *Semiconductor Lithography*, W. Moreau, Plenum Press, 1989, which is incorporated herein by reference.

The photoresist material is formulated by dissolving a polymer resin, a photoacid generator and a cross-linker in a casting solvent. A photosensitizing additive, commonly referred to as a sensitizer, is added to the formulation to increase the photosensitivity of the photoresist formulation. By varying the amount of sensitizer added to the photoresist, the photospeed of the development process can be modulated.

An important technical limitation of existing sensitizers is that they are not highly soluble in photoresist casting solvents or developer solutions, and consequently, the concentration of sensitizer that can be employed in the photoresist formulation is limited. Secondly, existing sensitizers are susceptible to sublimation during the baking process, thereby depleting the photoresist formulation of sensitizer. In addition, the sublimed sensitizer can coat the baking tools and then flake off during the subsequent process, redepositing on the device, resulting in further problems in the system.

While various sensitizers have been developed for use in photoresist formulations, the problems caused by their low solubility in photoresist casting solvents and developer solutions have not been addressed.

For example, U.S. Pat. No. 4,371,605, issued Feb. 1, 1983 to Renner and assigned to E. I. DuPont de Nemours and Company, discloses several anthracene derivatives that may be used as a sensitizer in the formulation of a photopolymerizable composition. The patent does not, however, address the problems caused by the sensitizers' low solubility.

U.S. Pat. No. 5,296,332, issued Mar. 22, 1994 to Sachdev et al. and assigned to International Business Machines Corporation, discloses high-sensitivity, high contrast, heat-stable photoresist compositions for use in deep UV, i-line e-beam and x-ray lithography. While the compositions disclosed are aqueous base developable, the potential problems caused by the sublimation of sensitizer and the deposition of the sublimed sensitizer as a physical precipitate on the semiconductor device remain unresolved.

Therefore, there exists a need to develop a sensitizer that is highly soluble in photoresist casting solvents and developer solutions, allowing the sensitizer to be used in greater concentration in the photoresist formulation, without the sublimation of the sensitizer during the baking process and the subsequent precipitation of the sublimed sensitizer during the development process.

SUMMARY OF THE INVENTION

A composition suitable for use as a sensitizer in a photoresist formulation for lithographic processes is disclosed. The composition comprises a typical monomeric sensitizer, e.g. 9-anthracene methanol, and a base-soluble long chain polymer backbone, e.g. poly-4-hydroxystyrene (PHS). The monomeric sensitizer is chemically bound to the polymer backbone to yield a polymer-bound sensitizer (PBS). As the polymer backbone is highly base-soluble, the resultant PBS is highly soluble in photoresist casting solvents and developer solutions. In addition, because varying amounts of the monomeric sensitizer can be bound to the polymer backbone, the concentration of sensitizer employed in the photoresist formulation is no longer limited. Furthermore, the PBS provides exposure and sensitization properties equivalent to those of the unbound monomeric sensitizer.

Numerous other advantages and features of the present invention will become readily apparent from the following detailed description of the preferred embodiment, the accompanying examples and the appended claims.

DETAILED DESCRIPTION OF THE PREFERRED EMBODIMENT

Although this invention is susceptible to embodiment in many different forms, preferred embodiments of the invention are shown. It should be understood, however, that the present disclosure is to be considered as an exemplification of the principles of this invention and is not intended to limit the invention to the embodiments illustrated.

A photoresist composition according to the present invention has several applications. First, is as a sensitizer in a photoresist formulation. The composition is highly soluble in both positive and negative photoresist casting solvents and in metal-ion free developer solutions, such as tetramethylammonium hydroxide (TMAH), thereby eliminating sublimation of the sensitizer during the baking process and the deposition of the sublimed sensitizer as a physical precipitate during the subsequent process. The composition, which in this application is referred to as a polymer-bound sensitizer (PBS), comprises a monomeric sensitizer bound to a base-soluble long chain polymer having a molecular weight within the range of 1000 to 250,000. The concentration of monomeric sensitizer that can be incorporated into the PBS is within the range of 1 to 25 mole percent (mole %), and preferably within the range of 1 to 15 mole %. The preferred method for incorporating the monomeric sensitizer and the polymer is an acid catalyzed alkylation mechanism such as a Friedel-Crafts acylation type reaction wherein the hydroxy (—OH) group remains intact, i.e., it is not replaced by the monomeric sensitizer.

Generally, a photoresist formulation includes a polymer resin, a photoacid generator (PAG), and a cross-linker, dissolved in a casting solvent. Optionally, a sensitizer is added to increase the formulation's photosensitivity. In a photoresist formulation according to one embodiment of the present invention, a PBS functions as the sensitizer. In an alternate embodiment of the present invention, the PBS can function as both sensitizer and the polymer resin. However, as the purpose of the polymer resin is to enhance the development of the photoresist material and to ensure development times of less than one minute, the PBS can only function as both species when realistic development times can be achieved without the inclusion of the added polymer resin.

In forming a semiconductor device such as an integrated circuit (IC) chip, the photoresist formulation is deposited on the device and then exposed to a chosen energy source, such as UV light, X-rays, or ion or electron beams. The PAG of the photoresist formulation reacts to the energy source and generates acid, which in turn causes polymerization reactions in the polymer resin. The sensitizer aids in this process by reacting with the energy source to initiate the photoreaction of the PAG. The cross-linker functions to create increased molecular weight polymers in the photoresist formulation. Portions of the photoresist formulation which are not polymerized are subsequently removed from the photoresist layer on the device with developer solution.

Examples of monomeric sensitizers that may be incorporated into the PBS composition include chrysenes, pyrenes, fluoranthenes, anthrones, benzophenones, thioxanthones and anthracenes, such as 9-anthracene methanol (ANME). Additional anthracene derivative sensitizers are disclosed in U.S. Pat. No. 4,371,605, which is incorporated herein by reference. The sensitizer may include oxygen or sulfur, however, the preferred sensitizers will be nitrogen-free, as the presence of nitrogen, e.g. an amine or phenothiazine group, tends to sequester the free acid generated during the exposure process and the formulation will lose photosensitivity.

Preferred polymer backbones for the PBS composition include any of the base-soluble long chain polymers suitable for use as a polymer resin in the photoresist formulation. Specific examples include: (i) aromatic polymers having an—OH group, e.g. polyhydroxystyrenes, such as poly-4-hydroxystyrene (PHS) (available from Maruzen America, New York, N.Y. and Hoechst Celanese of Corpus Christi, Tex.), novolak resins (available from Shipley of Marlboro, Mass.) and polymers having a phenol—OH group, e.g. phenol formaldehyde resins; (ii) polymers having an acid group, e.g. polymethacrylic acid with an ester side chain; and (iii) acrylamide group type polymers.

The polymer resin is base-soluble and compatible with developer solutions, such as aqueous solutions of metal-free ammonium hydroxide, tetramethylammonium hydroxide (TMAH), and tetraethylammonium hydroxide; metal containing potassium hydroxide; and sodium metasilicate. Preferred polymer resins have an average molecular weight within the range of 1000 to 250,000, and preferably within the range of 1000 to 25,000, to enhance its solubility in developer solutions. Examples include p-hydroxystyrene-maleic anhydride copolymers, polyhydroxystyrene-p-tertiarybutyl-carbonatostyrene copolymers, poly-4-hydroxystyrene, poly-3-hydroxystyrene polymers, poly-3-methyl-4-hydroxy styrene, poly-2-hydroxystyrene copolymers, phenol-formaldehyde resins, polymethyl methacrylate-teriary butyl methacrylate-polymethacrylic acid terpolymers and poly-4-hydroxystyrene-tertiary butyl methacrylate copolymers. Selected photoacid generators (PAG's) include, but are not limited to, MDT, from Daychem Labs, Centerville, Ohio, onium salts, aromatic diazonium salts, and sulfonium salts.

Preferred cross-linkers include, urea-formaldehyde condensates, melamine-formaldehyde condensates and methoxylated melamine-formaldehyde condensates such as hexa-N-methoxymethylmelamine,methoxylated-dimethoyl-cresols, dimethoyl-p-cresol and 1,3,5-methoxybenzene.

Preferred casting solvents include, propyleneglycol monomethyl ether acetate (PGMEA), ethyl lactate (EL), and cyclohexanone.

The preferred ranges of each of the components of a photoresist formulation in accordance with one embodiment of the present invention are: PBS, about 1 to about 96, more preferably, about 1 to about 40, weight percent (wt %) of total solids; polymer resin, 0 to about 96, more preferably about 20 to about 96, wt % of total solids; PAG, about 1 to about 20 wt % of total solids; cross-linker, about 1 to about 20 wt % of total solids; and casting solvent, 50 to 90 percent total weight of the formulation.

The preferred embodiment of the present invention is hereinafter described in more detail by means of the following examples that are provided by way of illustration and not by way of limitation.

EXAMPLES

1. PREPARATION OF POLYMER-BOUND ANME 24.2 grams (g) of poly-4-hydroxystyrene (PHS) is dissolved in 100 milliliters of acetonitrile. 10.4 g of ANME is added to the solution. When the ANME is completely in solution, three drops of concentrated hydrochloric acid is added and the solution refluxed for seventeen hours. The reaction mixture is cooled and neutralized with aqueous ammonium hydroxide. The resulting solution is added drop wise into one liter of deionized water and stirred for thirty more minutes. The precipitate obtained is filtered, washed twice with deionized water and dried in vacuo.

The product was characterized by gel permeation chromatography (GPC) and ultraviolet-Visible (UV-Vis) spectroscopy.

2. PROCEDURE FOR THE GPC ANALYSIS 0.25 g of PHS was dissolved in 100 g of tetrahydrofuran and to this solution was added 0.025 g (10% by weight) of ANME. The GPC was recorded on a Waters 150° C. instrument using ultrastyragel columns with tetrahydrofuran as the eluting solvent. The monomeric ANME peak was distinct from the polymer distribution. Another sample was prepared with the polymer-bound ANME sample prepared by the above procedure. The GPC trace did not show the presence of any monomeric ANME but did show an increase in the average molecular weight of the polymer.

3. PROCEDURE FOR THE UV-VIS SPECTROSCOPIC ANALYSIS

A 22 percent (%) solids solution of PHS was prepared in cyclohexanone. To this was added, ANME (10% by weight of total solids). The solution was cast as film on a quartz plate and the UV-Vis spectrum was recorded from the 200–800 nanometer (nm) range. The UV absorbance at 365 nm for a micron-thick film was 0.51. The same procedure was repeated with the polymer-bound ANME. The UV absorbance at 365 nm was 0.49 for a micron-thick film.

4. FORMULATION OF A NEGATIVE TONE Photoresist USING POLYMER-BOUND ANME

A negative tone i-line photoresist is formulated using the polymer-bound ANME (as prepared in example 1, above) as follows:

13.1 g PHS resin, 4 g polymer-bound ANME, 1.4 g bis(hydroxymethyl)p-cresol (an i-line cross-linker), 1.4 g of a photoacid generator (e.g., trifluoromethylsulfonyl-oxobicyclo (2,2,1)-hept-5-ene 2,3 dicarboximide (MDT, available from Daychem Labs of Centerville, Ohio) and 0.1 g FC-430 (a fluorocarbon surfactant available from 3-M Company) are dissolved in 84 g propyleneglycol monomethylether acetate solvent (PGMEA). A 1.08 micron film is cast, baked and exposed at 365 nm. The photospeed was less than 100 millijoules per square centimeter. The exposed wafers are baked on a hot plate, followed by development in aqueous base to resolve 0.4 micron images.

5. FORMULATION OF A POSITIVE TONE I-LINE Photoresist USING POLYMER-BOUND ANME A positive tone i-line photoresist is formulated as follows:

13.5 g hydroxystyrene\t-butyl methacrylate copolymer, 0.5 g photoacid generator (e.g., MDT) and 4 g polymer-bound ANME is dissolved in 84 g PGMEA solvent. The photoresist formulation thus obtained is cast on a 1.08 micron silicon wafer, soft baked, exposed, post-expose baked and developed in aqueous base developer. The photoresist resolved images comparable to a formulation using monomeric ANME with equivalent photospeed.

6. FORMULATION OF A NEGATIVE Photoresist USING MONOMERIC ANME

A negative photoresist formulation of 24 g ethyl-3-ethoxypropionate (EEP), 59.7 g 2-methoxy-1-propanol (Dowanol PM), 13.7 g PHS (available from Maruzen America, New York, N.Y.), 1.73 g MDT, 12.1 g 2,6-dimethoyl-p-cresol, 5.11 g ANME and 0.01 g FC-430 was formulated.

A 4 micrometer film was formed by spin coating at 3000 rotations per minute. A cover dish of watch glass was placed over the wafer and the wafer baked at 100° Celsius for 2 minutes. Twelve consecutive wafers were baked in this manner and the watch glass was washed with methanol and analyzed for ANME. The UV-Vis revealed the presence of deposited ANME on the watch glass.

7. FORMULATION OF A NEGATIVE Photoresist USING PHS-GRAFTED ANME

In a separate experiment, the formulation of example 6, above, was modified to include 6.4 g of PHS-grafted ANME (containing 40 percent ANME) in place of the 5.11 g of monomeric ANME. The identical process parameters were followed, and following the bake of twelve consecutive wafers, the watch glass was analyzed for anthracene groups in the deposit and none were detected (within the sensitivity limit of 10 parts per billion).

8. RELATIVE SOLUBILITIES OF MONOMERIC ANME AND PHS-GRAFTED ANME

The solubility of monomeric ANME and of the PHS-grafted ANME was tested in 0.263N tetramethylammonium hydroxide (TMAH) and in casting solvents of propyleneglycol-monomethylether acetate (PGMEA) and ethyl lactate (EL). The following table illustrates the results that were obtained:

TABLE 1

|  | 0.263N TMAH | PGMEA | EL |
| --- | --- | --- | --- |
| ANME | insoluble | insoluble | soluble (2% by weight) |
| PHS-ANME | soluble (10% by weight) | soluble (30% by weight) | soluble (30% by weight) |

A second application for a composition according to the present invention is as a soluble dye for deep UV positive or negative photoresist formulations. Generally, a dye is added to a photoresist formulation to reduce the effect of image distortion caused by lateral scattered radiation from a reflective substrate. The dye is soluble in developer and does not leave a residue on the substrate. This application is of particular use where the lithographic process involves very high baking temperatures, above 140° C., where sublimation of greater amounts of the unbound sensitizer occurs.

A further application of the PBS of the present invention is in the formulation of an acid labile terpolymer photocomposition. The PBS functions as a backbone onto which acid labile groups, as described in U.S. Pat. No. 4,491,628 which is incorporated herein by reference, may be attached. For example, when the PBS includes poly-4-hydroxystyrene (PHS) as the polymer backbone, the acid labile group is attached to the polymer's phenolic side.

This invention has been described in terms of a specific embodiment, set forth in detail. It should be understood, however, that this embodiment is presented by way of illustration only, and that the invention is not necessarily limited thereto. Modifications and variations within the spirit and scope of the claims that follow will be readily apparent from this disclosure, as those skilled in the art will appreciate.

We claim:

1. The composition suitable for use as a negative photoresist material comprising:
    a polymer-bound sensitizer including:
        between 1 and 25 mole percent of a monomeric sensitizer selected from the group consisting of chrysenes; pyrenes; fluoranthenes; anthrones; benzophenones; thioxanthones; and anthracenes; and
        a base-soluble long chain polymer having a molecular weight within the range of 1000 to 250,000 selected from the group consisting of p-hydroxystyrene-maleic anhydride copolymers; polyhydroxystyrene-p-tertiarybutyl-carbanatostyrene copolymers; poly-4-hydroxystyrene; poly-3-hydroxystyrene polymers; poly-3-methyl-4-hydroxy styrene; poly-2-hydroxystyrene copolymers; phenol-formaldehyde resins; polymethyl methacrylate-tertiary butyl methacrylate polymethacrylic acid terpolymers; and poly-4-hydroxystyrene-tertiary butyl methacrylate copolymers;
    a polymer resin;
    a photoacid generator; and
    a cross-linker wherein the composition is dissolved in a photoresist casting solvent.

2. The composition suitable for use as a positive photoresist material comprising:
    a polymer-bound sensitizer including:
        between 1 and 25 mole percent of a monomeric sensitizer selected from the group consisting of chrysenes; pyrenes; fluoranthenes; anthrones; benzophenones; thioxanthones; and anthracenes; and a base-soluble long chain polymer having a molecular weight within the range of 1000 to 250,000 selected from the group consisting of p-hydroxystyrene-maleic anhydride copolymers; polyhydroxystyrene-p-tertiarybutyl-carbanatostyrene copolymers; poly-4-hydroxystyrene; poly-3-hydroxystyrene polymers; poly-3-methyl-4-hydroxy styrene; poly-2-hydroxystyrene copolymers; phenol-formaldehyde resins; polymethyl methacrylate-tertiary butyl methacrylate polymethacrylic acid terpolymers; and poly-4-hydroxystyrene-tertiary butyl methacrylate copolymers;

a polymer resin; and a photoacid generator.

3. An article of manufacture having coated on a substrate a negative photoresist material comprising:

a polymer-bound sensitizer including:

between 1 and 25 mole percent of a monomeric sensitizer selected from the group consisting of chrysenes; pyrenes; fluoranthenes; anthrones; benzophenones; thioxanthones; and anthracenes; and a base-soluble long chain polymer having a molecular weight within the range of 1000 to 250,000 selected from the group consisting of p-hydroxystyrene-maleic anhydride copolymers; polyhydroxystyrene-p-tertiarybutyl-carbanatostyrene copolymers; poly-4-hydroxystyrene; poly-3-hydroxystyrene polymers; poly-3-methyl-4-hydroxy styrene; poly-2-hydroxystyrene copolymers; phenol-formaldehyde resins; polymethyl methacrylate-tertiary butyl methacrylate polymethacrylic acid terpolymers; and poly-4-hydroxystyrene-tertiary butyl methacrylate copolymers;

a polymer resin;

a photoacid generator; and a cross-linker wherein the composition is dissolved in a photoresist casting solvent.

4. An article of manufacture having coated on a substrate a positive photoresist material comprising:

a polymer-bound sensitizer including:

between 1 and 25 mole percent of a monomeric sensitizer selected from the group consisting of chrysenes; pyrenes; fluoranthenes; anthrones; benzophenones; thioxanthones; and anthracenes; and a base-soluble long chain polymer having a molecular weight within the range of 1000 to 250,000 selected from the group consisting of p-hydroxystyrene-maleic anhydride copolymers; polyhydroxystyrene-p-tertiarybutyl-carbanatostyrene copolymers; poly-4-hydroxystyrene; poly-3-hydroxystyrene polymers; poly-3-methyl-4-hydroxy styrene; poly-2-hydroxystyrene copolymers; phenol-formaldehyde resins; polymethyl methacrylate-tertiary butyl methacrylate polymethacrylic acid terpolymers; and poly-4-hydroxystyrene-tertiary butyl methacrylate copolymers;

a polymer resin; and a photoacid generator.

* * * * *